United States Patent [19]
Quarles et al.

[11] Patent Number: 6,101,323
[45] Date of Patent: Aug. 8, 2000

[54] METHOD AND APPARATUS FOR IMPROVEMENT OF SPARSE MATRIX EVALUATION PERFORMANCE

[75] Inventors: Thomas L. Quarles, Boulder Creek; S. Peter Liebmann, Santa Cruz; Leslie D. Spruiell, Santa Clara, all of Calif.

[73] Assignee: Antrim Design Systems, Inc., Scotts Valley, Calif.

[21] Appl. No.: 09/116,010

[22] Filed: Jul. 15, 1998

[51] Int. Cl.[7] .................................................. G06F 17/50
[52] U.S. Cl. ................. 395/500.23; 395/500.35
[58] Field of Search ................ 395/500.23, 500.24, 395/500.25, 500.34, 500.35

[56] References Cited

U.S. PATENT DOCUMENTS

| | | |
|---|---|---|
| 4,985,860 | 1/1991 | Vlach . |
| 5,157,778 | 10/1992 | Bischoff et al. .................... 395/500.35 |
| 5,313,398 | 5/1994 | Rohrer et al. ....................... 395/500.35 |
| 5,369,594 | 11/1994 | Huang et al. ........................... 364/488 |
| 5,379,231 | 1/1995 | Pillage et al. ....................... 395/500.35 |
| 5,396,615 | 3/1995 | Tani . |
| 5,467,291 | 11/1995 | Fan et al. ............................ 395/500.35 |
| 5,469,366 | 11/1995 | Yang et al. ............................. 364/489 |
| 5,623,419 | 4/1997 | Kundert . |
| 5,634,115 | 5/1997 | Fitzpatrick et al. . |
| 5,692,158 | 11/1997 | Degeneff et al. ................... 395/500.23 |
| 5,781,764 | 7/1998 | Degeneff et al. ................... 395/500.23 |
| 5,872,952 | 2/1999 | Tuan et al. .......................... 395/500.35 |

OTHER PUBLICATIONS

Bischoff, G., Cayenne: A Parallel Implementation of the Circuit Simulator SPICE; Digital Equipment Corporation, Hudson Massachusetts, CH2352–1/86/0000/0182 © 1986 IEEE. no pg. #.

Nagel, L., SPICE 2: A Computer Program to Simulate Semiconductor Circuits; ERL Memo UCB/ERL M75/520, University of California, Berkeley, May 1975. no pg. #.

Cohen, E., Program Reference for SPICE 2; ERL, University of California, Berkeley, Jun. 1976. no pg. #.

Quarles, T., Analysis of Performance and Convergence Issues for Circuit Simulation; EECS, University of California, Berkeley, Apr. 1989. no pg. #.

*Primary Examiner*—Paul R. Lintz
*Assistant Examiner*—Leigh Marie Garbowski
*Attorney, Agent, or Firm*—Fliesler Dubb Meyer & Lovejoy LLP

[57] ABSTRACT

A device for reducing evaluation time of a matrix representing an electrical circuit. Conductance values of each circuit component in the circuit are written to corresponding models utilizing non-blocking writing techniques. The matrix is represented by a reduced memory structure where each matrix node is represented by a matrix element structure having at least one pointer to a conductance value contained in a model structure corresponding to a circuit component that contributes to a value of the matrix node. A set of rows or columns of the matrix are then processed to calculate final matrix node values independently.

43 Claims, 12 Drawing Sheets

THE MATRIX STAMP FOR THIS RESISTOR CONTAINS POSITIVE VALUES OF G ON THE DIAGONAL AND NEGATIVE VALUES OF G ON THE OFF DIAGONAL

METHOD AND APPARATUS FOR IMPROVEMENT OF SPARSE MATRIX EVALUATION PERFORMANCE

BACKGROUND OF THE INVENTION

1. Field of the Invention

This invention relates to improving the performance of matrix evaluations. The invention is also related to an improvement in performance in evaluating sparse matrices having at least one model containing information for at least one node in the matrix being evaluated. The invention is still further related to an improvement in the performance of matrix evaluations where the sparse matrix represents Kirchoff's voltage and current laws for an electronic circuit being evaluated, and where the models represent specific structures and contain at least one conductance contribution value of an electronic circuit component of the electronic circuit.

2. Discussion of the Background

The use of matrix based solvers (matrix solutions) to simulate transient behavior of electronic circuits dates back to 1 975, and is in wide use in the electronic design community. Nagel, L., SPICE 2: *A Computer Program to Simulate Semiconductor Circuits*, ERL Memo UCB/ERL M75/520, University of California, Berkeley, May 1975, hereinafter, SPICE; see also Cohen, E., *Program Reference for SPICE 2*, ERL, University of California, Berkeley, June 1976, hereinafter Cohen, and Quarles, T., Analysis of Performance and Convergence Issues for Circuit Simulation, EECS, University of California, Berkeley, April 1989, hereinafter, Quarles. This method of solution relies on the fact that differential circuit equations that describe transient behavior of circuits can be written as conductance coefficients (G) into a matrix, and the matrix can be solved to obtain new voltage values at each node of the circuit.

The use of matrix solutions has relied on a number of techniques to improve solution performance. Starting with SPICE, sparse matrix techniques have been utilized to reduce the amount of memory required to store the entire matrix. While sparse matrix systems reduce the amount of memory needed, they require a trade-off in performance due to the fact that the location of an individual matrix entry must be stored and because the matrix solution cannot be calculated through simple matrix index mathematics as in non-sparse systems.

FIG. 1A is a circuit diagram of a two resistor circuit ($R_1$ and $R_2$) having three circuit nodes ($N_1$, $N_2$, and $N_3$). FIG. 1B is a matrix representing conductance values (G) of the two resistor circuit. The matrix element labeled $G_1+G_2$ represents the circuit equation coefficients for the node $N_2$ between the resistors.

In a single processor computer, matrix evaluation cycles proceed according to the flow diagram in FIG. 2. For each time point in the simulation, all of the device models are evaluated and the result is added to the matrix entry in a serial fashion. At Step 20, a model is evaluated. Such model can be, for example, a model representing resistor $R_1$ in FIG. 1A. The model evaluation determines the conductance values (G) of the circuit element, resistor $R_1$. At Step 22, the matrix is loaded with the conductance values determined in the model evaluation Step 20. In this example, the conductance values of the circuit element resistor R, is collectively referred to as a matrix stamp R, is inserted into the matrix (see Matrix stamp of $R_1$, FIG. 1B). Steps 20 and 22 are repeated for each model to be evaluated.

At Step 24, the matrix is solved to determine voltage values at each node of the circuit. At Step 26, a convergence test is utilized to determine whether or not the circuit has reached a steady state solution. An example convergence test compares values at a vector of new nodal voltages ($X_i$) to values from a last convergent time point ($X_{i-1}$), and is defined as:

$$X_i - X_{i-1} \leq \text{Abstol} + \text{Reltol} * \text{Max}(X_i, X_{i-1}),$$

where Astol and Reltol are user defined convergence control variables of the simulator (having default values of 1e−6 and 1e−3 respectively), and the function Max( ) returns the largest of two values.

If the convergence test does not reach steady state, the entire process is repeated for another simulated time point. In the above process, because the model evaluation can occupy as much as 50 percent of the processor's time, this leads to extremely long runs in large circuit simulation can be experienced.

The conventional implementation of matrix solvers has relied on device model structures similar to Resistor Model Structure 30 shown in FIG. 3. Resistor Model Structure 30 stores identifying information 32, including an instance and model identifier, and the conductance value G 36, as evaluated during model evaluation (Step 20 in FIG. 2, for example). In addition, Resistor Model Structure 30 stores the memory locations of the matrix entries (Pointers 38, for example). This mechanism requires that after each device model is evaluated, the new values of G (36, for example) must be 'stamped' into the matrix during the matrix load phase. In a multiple processor system, each evaluation of a device model can be handed to a separate processor. As shown in FIG. 4, model evaluations 40a, 40b, and 40c are processed in parallel. While this can lead to some improvement in simulation time, the overall performance of the system will not be improved dramatically due to the nature of shared memory systems. Shared memory is utilized because some circuit equations cause overlapping entries at matrix positions where two or more circuit elements meet to form a circuit node, therefore the effect of adding additional processors is reduced because of a time consuming, serial process of matrix load (Step 42).

If each device model is evaluated by a separate processor, then the simulation can enter a situation known as a blocking memory write in which two (or more) processors attempt to write to the same memory location. This can be seen by referring to the matrix entry labeled G1+G2 in FIG. 1B and corresponding to node $N_2$ in FIG. 1A, which shows that the value of this element has conductance contributions $G_1$ and $G_2$ from resistors $R_1$ and $R_2$, respectively.

Some mechanism must be provided to prevent two processors from writing to a given memory location simultaneously. A blocking memory write prevents simultaneous writes by locking a memory location (matrix entry), reading it's value, adding the evaluation of the other models (conductances) that contribute to this nodal voltage, and then unlocking the memory location. However, blocking memory writes are expensive due to the fact that all other processes that are contributing to the value at the memory location being written are blocked until the lock/unlock cycle completes. Furthermore, in order to avoid an enormous number of memory location lock operations and associated bookkeeping and memory consumption involved in managing those locks, multi-processing systems have historically locked and unlocked the entire matrix before and after each stamping step.

Bischoff and Greenburg's original method Bischoff, G., and Greenburg, S., *Cayenne—A Parallel Implementation of the Circuit Simulator SPICE*, Digital Equipment Corporation, Hudson Mass., CH2353-1/86/0000/0182© 1986 IEEE, hereinafter Bischoff and Greenburg, overcomes this blocking problem by changing the matrix entry from a single scalar value to a sum value and a vector of individual conductances. As shown in FIG. 5, each matrix position (50, for example) includes a vector 52 where each vector entry (G2, for example) is a collection point for a single model evaluation. Thus, if two device models are connected to a circuit node, that node is represented in the matrix as a matrix position having three values, two of which provide locations for non-blocking writes by separate model evaluation processes (vector 52), and one of which is a sum value 54.

The effect of Bischoff and Greenburg's method on the matrix evaluation loop is shown in FIG. 6. Model evaluations 40a, 40b, and 40c are performed as before, however, matrix loads shown as matrix load 62a, 62b and 62c are now performed in parallel. Each matrix load performs stamping, via nonblocking writes, of individual conductance values from individual circuit elements into a single matrix position (vector entry). Steps 64a, 64b and 64c represent the summing of the sum values at each matrix position (sum value 54, FIG. 5, for example).

Bischoff and Greenburg's method provides an improvement in evaluation time of circuit simulations. However, because of the complexity of most circuits being evaluated, significant computational time is still required.

SUMMARY OF THE INVENTION

Accordingly, it is an object of this invention to provide an improvement in time required to evaluate a matrix by providing an arrangement of device models having values stored therein and providing pointers in the matrix being evaluated to the device model stored values.

It is another object of the present invention to provide an improvement in evaluation of electrical circuits via a matrix having pointers to device models containing conductance values of electronic components in the electrical circuit.

It is yet another object of the present invention to provide a method of evaluating a matrix representing an electrical circuit by eliminating the need for matrix locking and a matrix load phase by reading conductance values for electronic components in the circuit from a device model.

It is yet another object of the present invention to reduce the amount of memory required to maintain a matrix being evaluated.

These and other objects are accomplished by an apparatus for storing and accessing matrix coefficients for a circuit simulation, which apparatus includes an input device configured to input conductance elements corresponding to matrix coefficients, a storage device configured to store each conductance element in at least one component model structure, a data structure comprising plural nodes, each node corresponding to a matrix coefficient and having at least one pointer, a pointer reference mechanism configured to reference pointers in each respective node of the data structure to conductance elements which are stored in the component model structure and which correspond to the matrix coefficient of the respective node, and an access device configured to access one or more of said matrix coefficients utilizing a corresponding node of the data structure.

Alternatively, the above objects may be accomplished via a method of storing and accessing matrix coefficients, comprising the steps of retrieving data elements corresponding to at least one matrix coefficient, storing each data element in at least one model, building a data structure having plural nodes, each node corresponding to a matrix coefficient and having at least one pointer, referencing pointers in each respective node of said data structure to reference model stored data elements corresponding to at least part of the matrix coefficient of the respective node, and accessing a matrix coefficient utilizing a corresponding node of said data structure.

The above described apparatus and method eliminate the matrix load phase in favor of directly reading the conductance values from the model data structures. This leads to performance enhancement by eliminating the need to lock the matrix for writes. It also reduces the amount of memory required by reducing the number of double floating point values held in the matrix (total of 32 bytes for a resistor) to four single precision pointers (16 bytes total).

Other aspects and advantages of the present invention can be seen upon review of the figures, the detailed description, and the claims which follow.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

The present inventors have realized that although Bischoff and Greenburg improves the performance of the simulation loop significantly, it still is expensive in the matrix load phase due to the fact that many copies of the same number must be 'stamped' into the matrix.

The present inventors have also realized that one of the most time consuming phases of a simulation as implemented in SPICE, Cohen, and Quarles is the matrix load phase. This phase consists of 'stamping' the matrix with new values of conductance whenever the model is reevaluated. Since this phase takes place on every simulated time point it is responsible for as much as 50 percent of the overall run time.

Figure 1A:
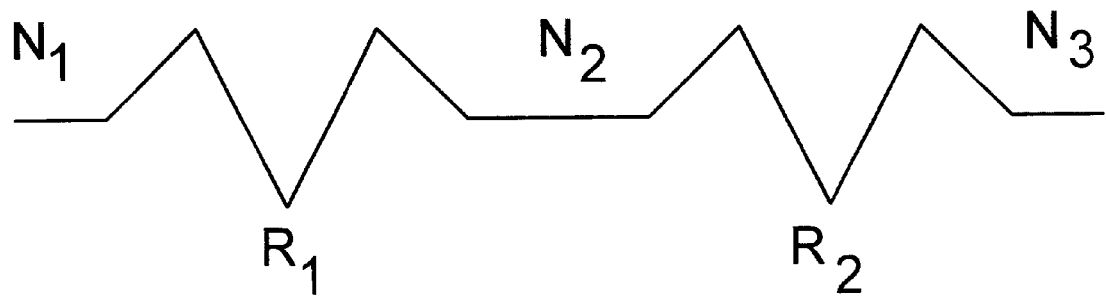
FIG. 1A is a circuit diagram of a two-resistor circuit.
Figure 1B:
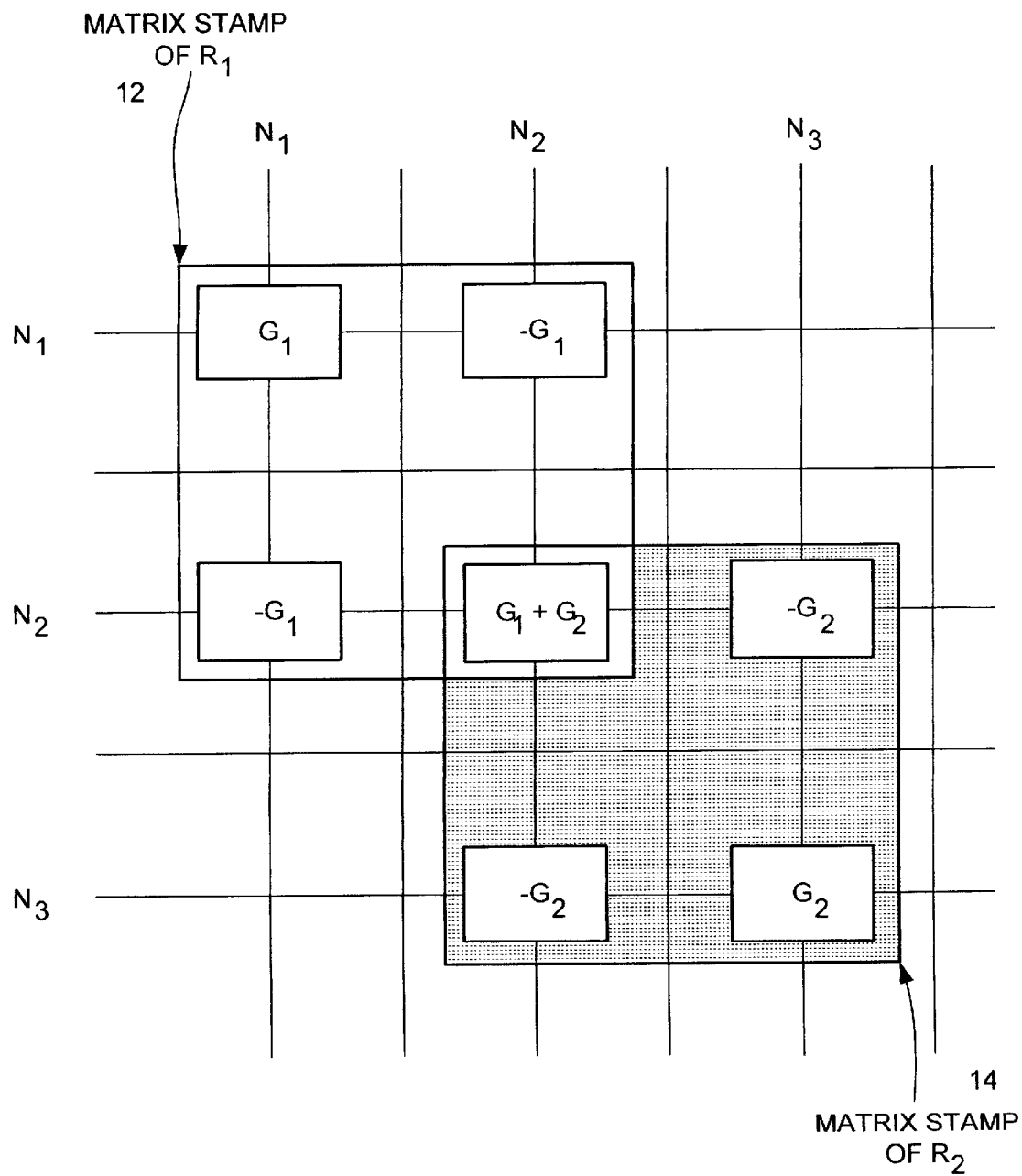
FIG. 1B is an illustration of a matrix representing the two-resistor circuit of FIG. 1A.

The present invention involves the nature of the values that are written at each point in a device element's matrix stamp (Matrix stamp of $R_1$, 12, FIG. 1B, for example). In FIG. 1, the entries for $G_1$ represent the conductance of the device $R_1$ at any point in the simulation. If the device model that is used to evaluate the resistor $R_1$. is a basic resistor model, then the value of $G_1$ will always equal $1/R_1$. Thus the value of $G_1$ can be calculated once and stored in the model. This is true for many of the device models that can be simulated by SPICE, Cohen, and Quarles. However, by reversing the model data structures with respect to SPICE, Cohen, and Quarles, and by extending Bischoff and Greenburg, this invention can reduce the evaluation time of the matrix.

Figure 7:
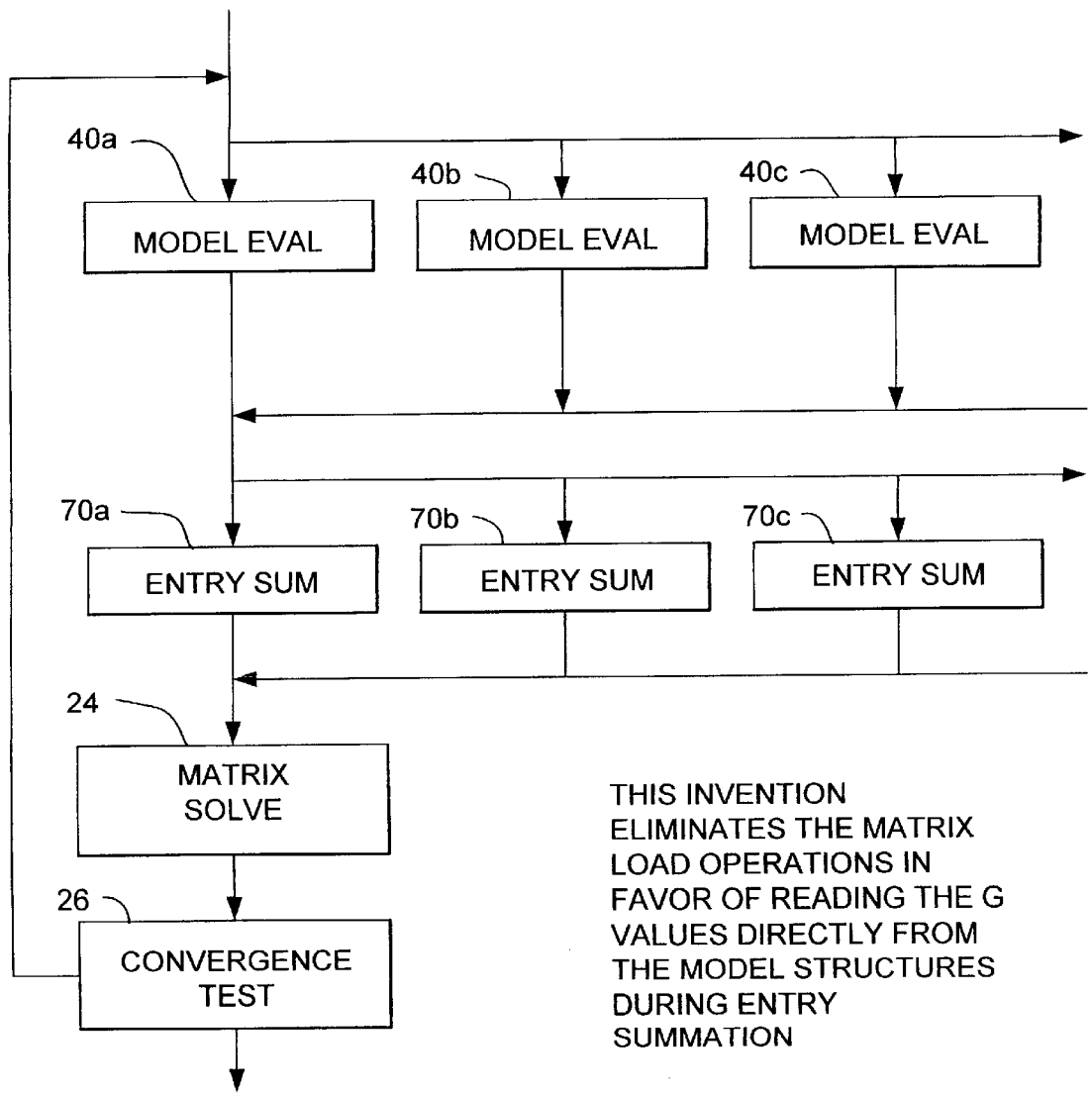
FIG. 7 illustrates a matrix solution loop with multiple processors and inverted data structures according to the present invention.

The Matrix Solution Loop according to the present invention is shown In FIG. 7. FIG. 7 includes a model evaluation phase having Model Evaluations 40a, 40b, and 40c in parallel without a matrix load. After the model evaluation phase, the available processors can be handed a set of rows or columns and be allowed to calculate the final sum (placing it in the sum location, i.e., summation phase) independent of each other via entry sum 70a, 70b, and 70c, for example. The horizontal arrows represent that all model evaluations are completed prior to any Entry Sum Calculations. This summation phase can operate in parallel and taken together, the entire process can achieve very high matrix evaluation performance without complex, time consuming memory locking schemes.

Figure 8:
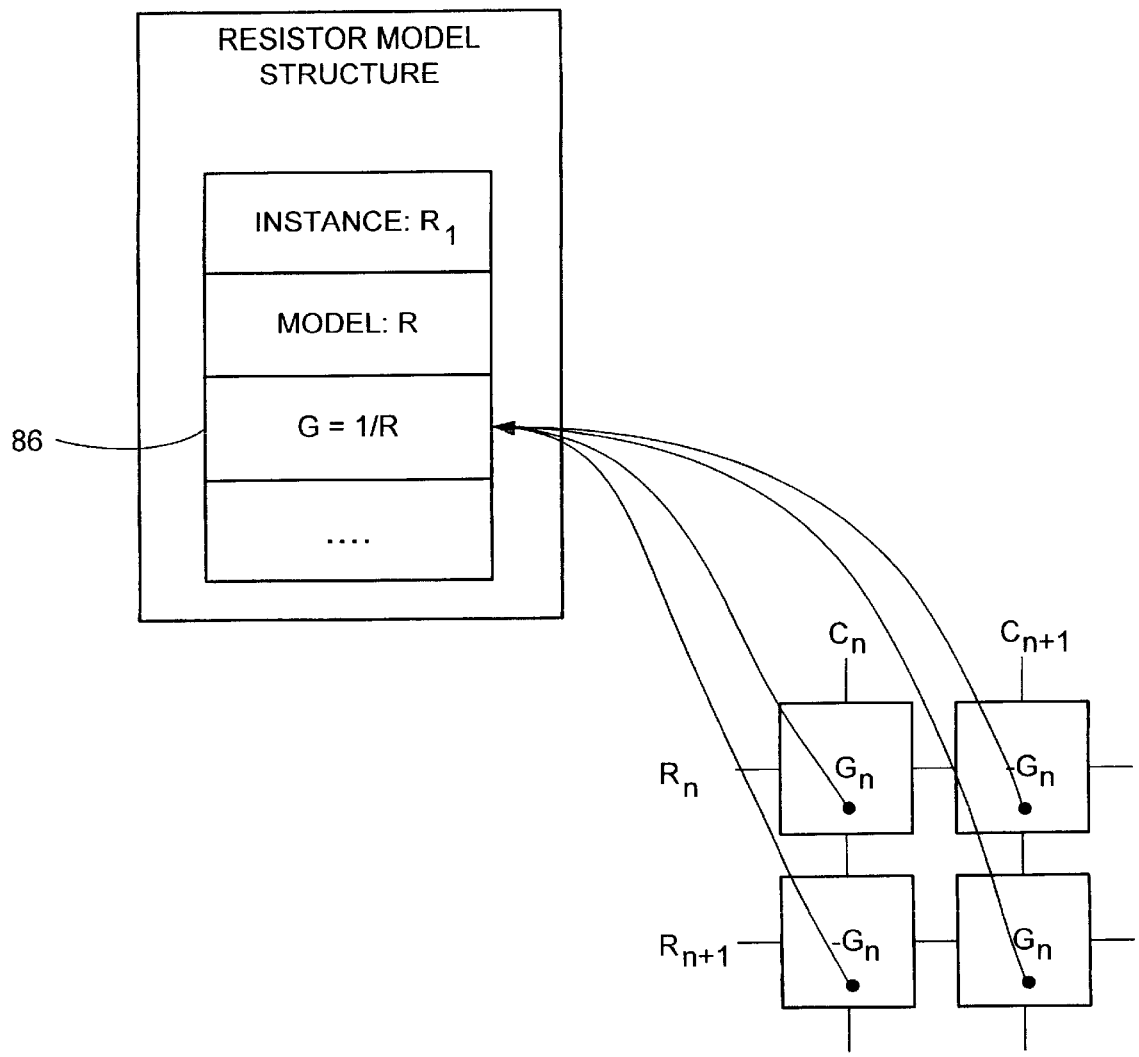
FIG. 8 illustrates an inverted model and matrix data structure according to the present invention.

In achieving the above, the present invention inverts the model and matrix data structures as show in FIG. 8. During the matrix evaluation phase, the values of the matrix entries can be found by reference (matrix entries $G_n$ and $-G_n$ reference G=1/R, 86, for example) instead of being replaced ("stamped") during matrix load. Thus, the present invention improves the overall simulation time due to the fact that the locations in memory of the matrix entries can simply be dereferenced to obtain the required values instead of actively updating each location (i.e., matrix entries $G_n$ and $-G_n$ are not actively updated). Since the model contains the knowledge of when a conductance value is updated, and the matrix refers to that value (updated or not), there is no need to actively stamp each matrix entry during a matrix load phase.

Figure 9:
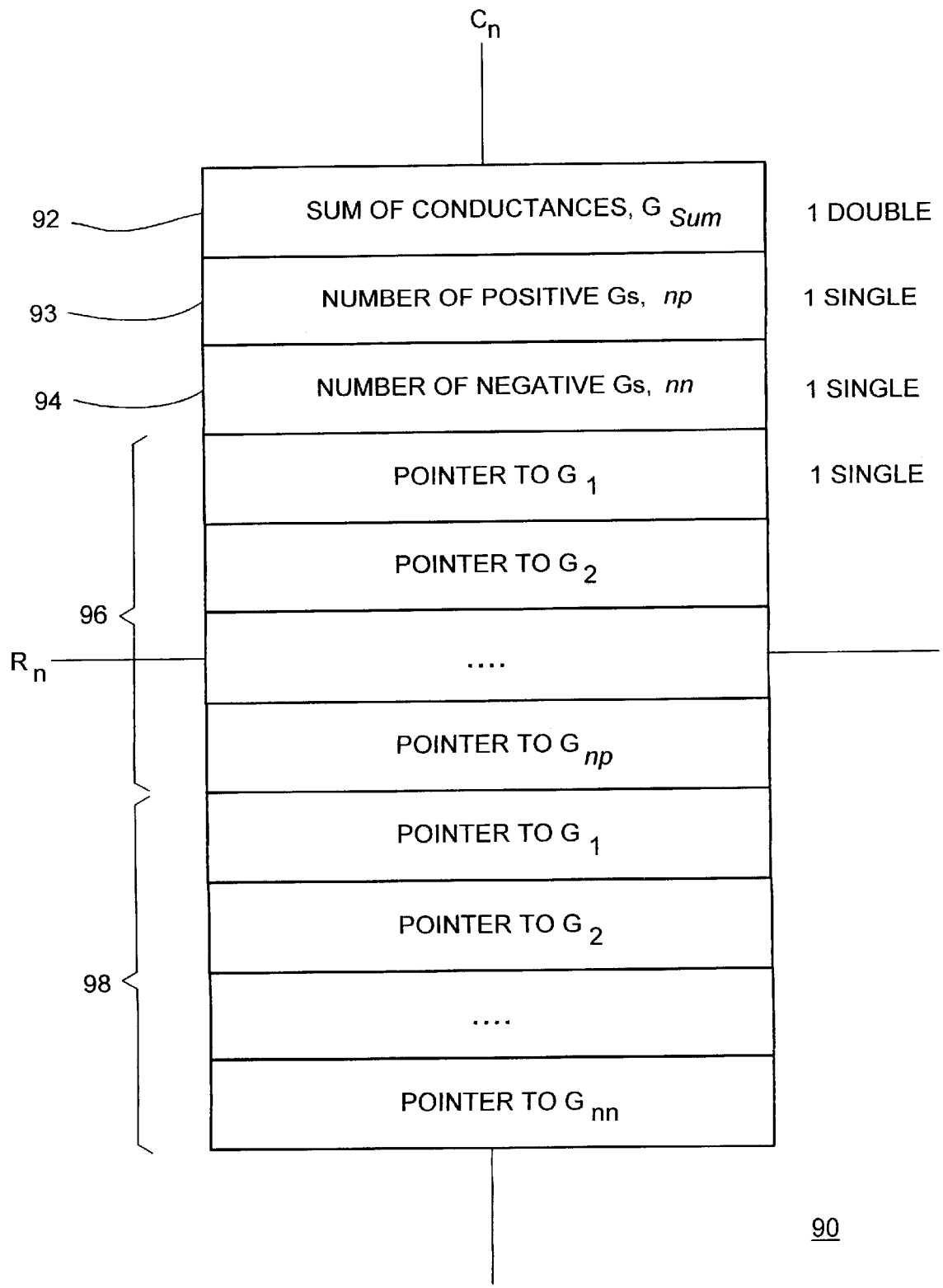
FIG. 9 illustrates a complex matrix element structure according to the present invention.

FIG. 9 illustrates an example of a complex matrix element structure (structure of a matrix entry) according to the present invention. In FIG. 9, the matrix element structure 90 includes a sum of conductances 92, a number of positive conductances 93, a number of negative conductances 94, and two groups of pointers 96 and 98, containing pointers to positive and negative conductance values respectively.

Figure 10A:
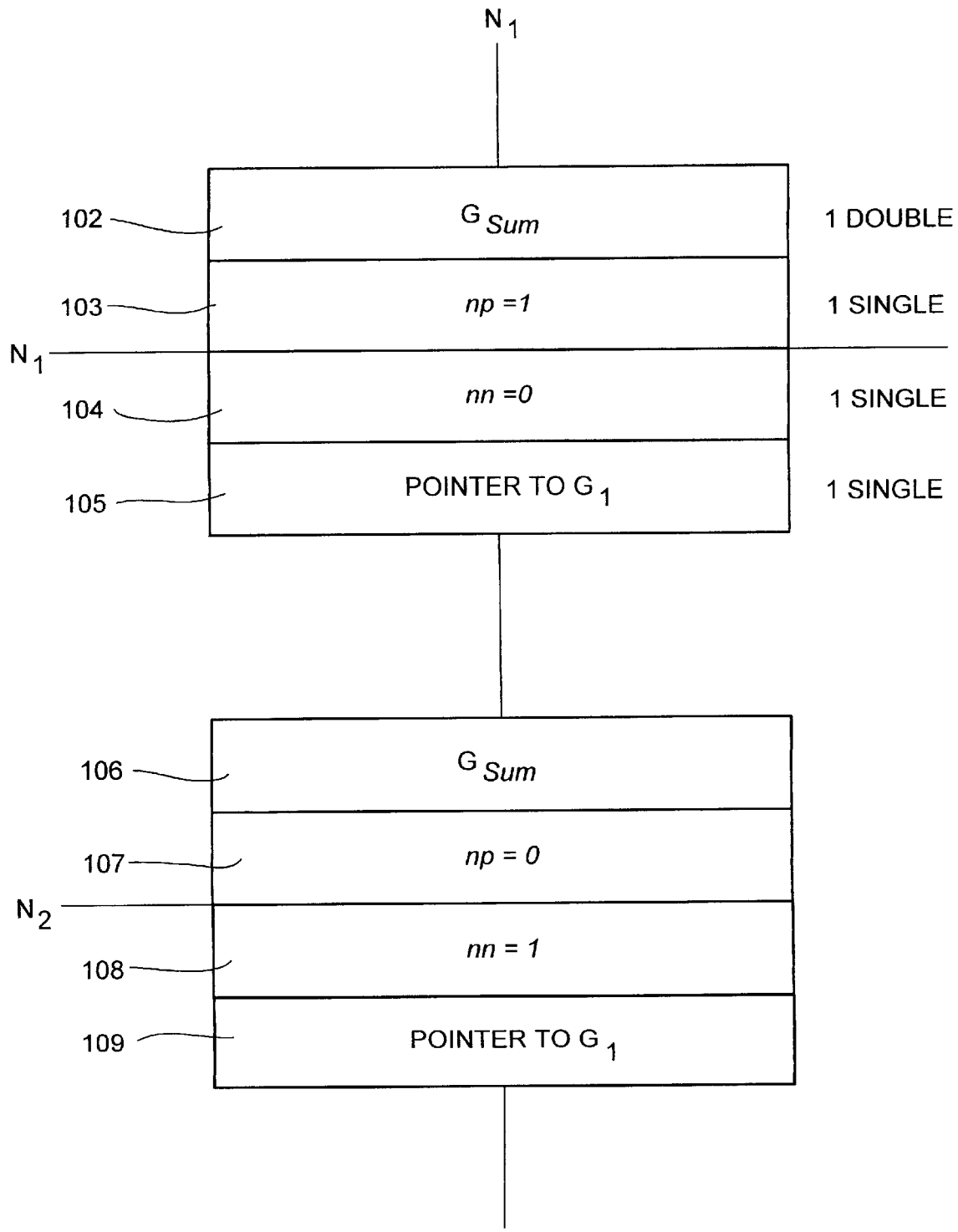
FIG. 10A illustrates a matrix data structure for $R_1$ at rows $N_1$ and $N_2$ of column $N_2$ for the two-resistor circuit of FIG. 1A according to the present invention.
Figure 10B:
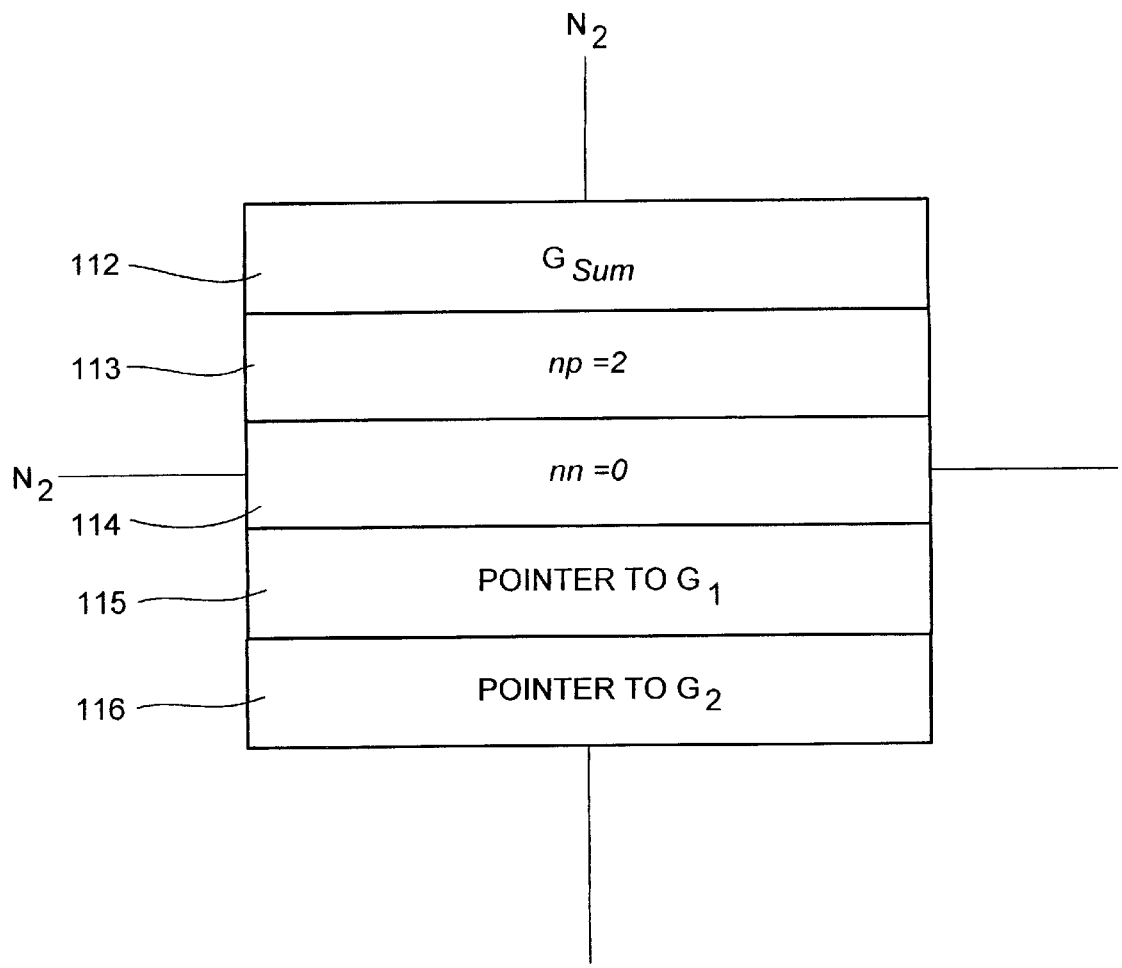
FIG. 10B illustrates a matrix data structure for node $N_2$ of the two-resistor circuit of FIG. 1A, according to the present invention.

A portion of the matrix data structure for the two resistor example (FIG. 1A) using the present invention is shown in FIGS. 10A and 10B. As shown in FIG. 10A, matrix entries at rows $N_1$ and $N_2$ for column $N_1$ of the matrix data structure (FIG. 1B) for $R_1$ is illustrated. At row $N_1$, a $G_{Sum}$ value 102, a number of positives 103, a number of negatives 104, and a pointer to $G_1$ 105 is shown. At row $N_2$, a $G_{Sum}$ 106, a number of positives 107, and a number of negatives 108, and a pointer to $G_1$ 109 is shown. In FIG. 10B, the matrix entry (at row $N_2$, column $N_2$, FIG. 1B) corresponding to node $N_2$ (FIG. 1A) of the two resistor circuit is shown, including $G_{Sum}$ 112, number of positives 113, number of negatives 114, pointer to $G_1$ 115, and pointer to $G_2$ 116.

The evaluation of the final conductances for any given node is achieved by equation (1):

$$G_{Sum} = \sum_{i=1}^{i=np} G_i - \sum_{j=1}^{j=nn} G_j \qquad (1)$$

where each conductance contribution to $G_{Sum}$ ($G_i$ and $G_j$, for example) is not locked, thus allowing $G_{sum}$ for each node to be calculated without memory blocking by a separate processor. Therefore, applying equation 1 to the matrix entries defined in FIG. 10A, conductance values of $G_1$ and $-G_1$ are derived for rows $N_1$ and $N_2$, respectively, for column $N_1$. Similarly, a conductance value of $G_1+G_2$ is derived for the matrix entry corresponding to node $N_2$ (row $N_2$, column $N_2$).

Figure 2:
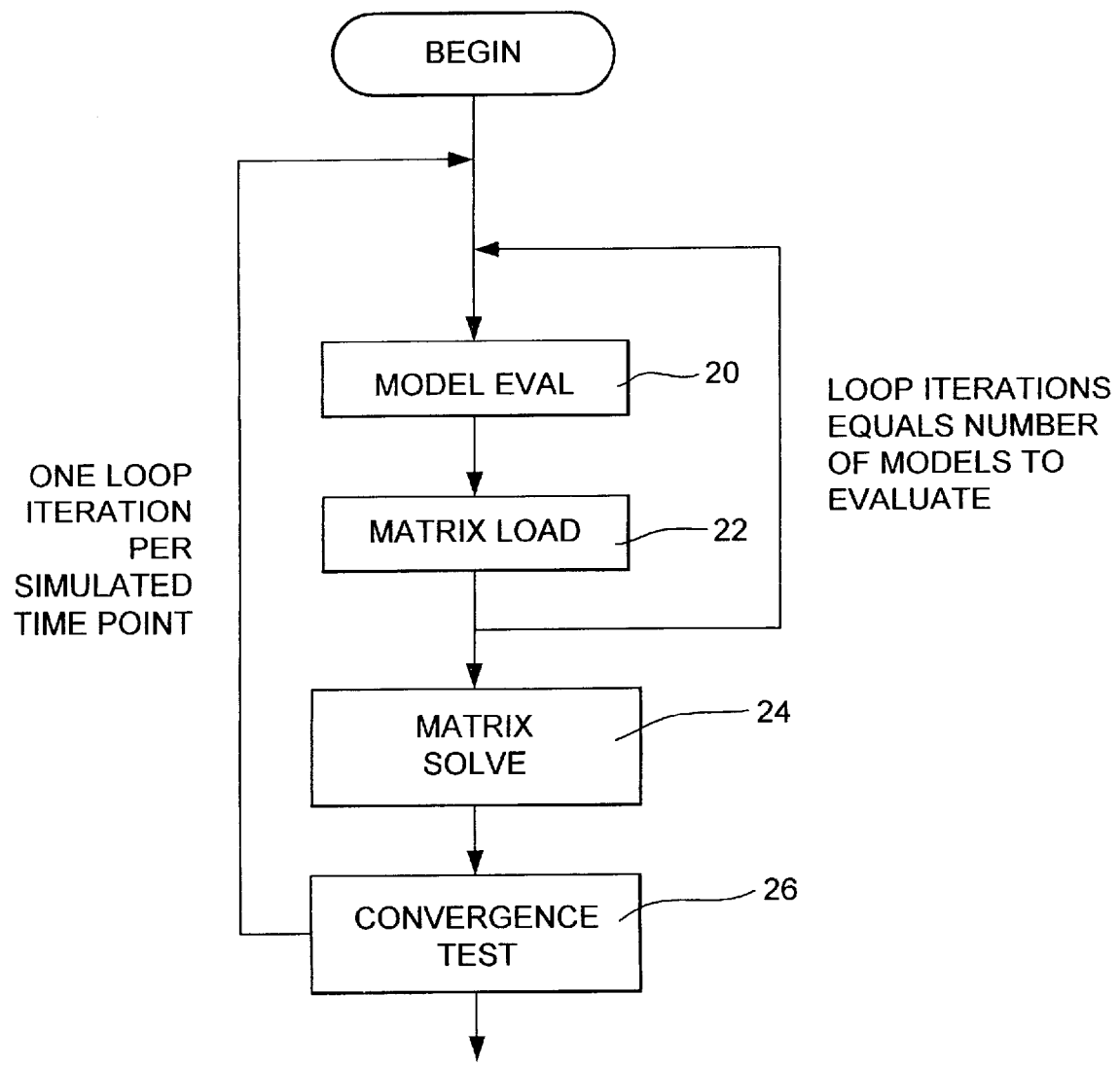
FIG. 2 is a flowchart illustrating matrix evaluation, matrix load, and matrix solve that occur at each time point in a matrix solution loop in a single processor system.
Figure 3:
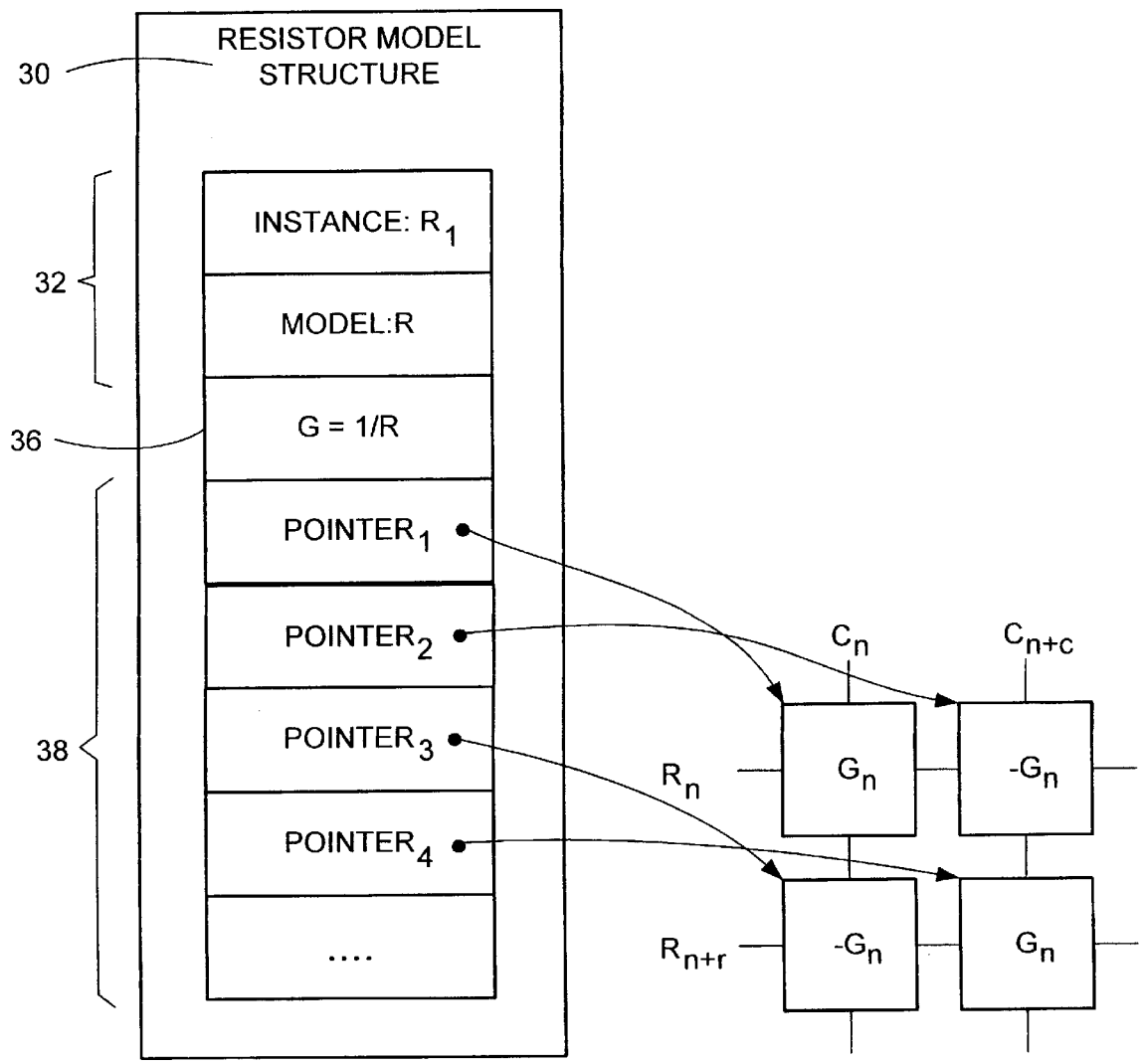
FIG. 3 illustrates a conventional data structure utilized in matrix solvers.
Figure 4:
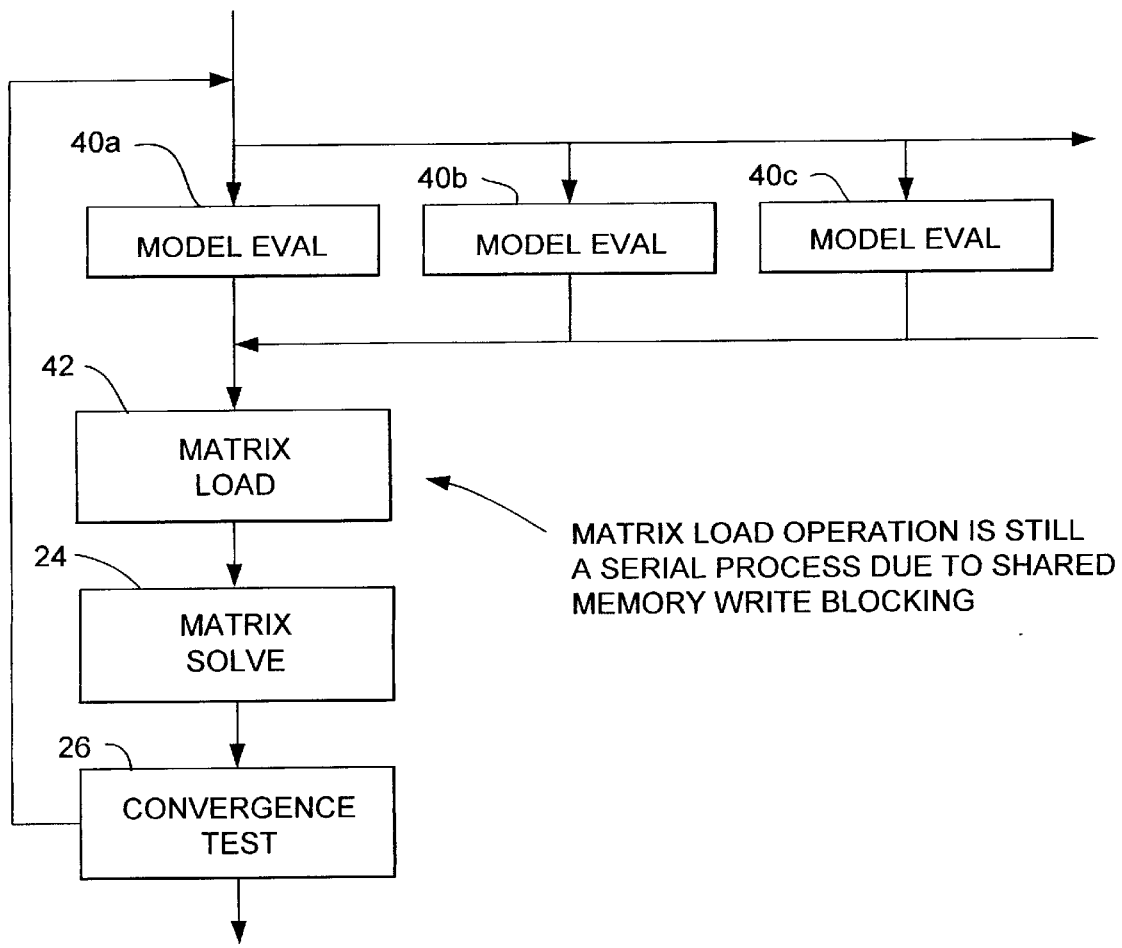
FIG. 4 is a flowchart illustrating a matrix solution loop with multiple processors and memory write blocking.
Figure 5:
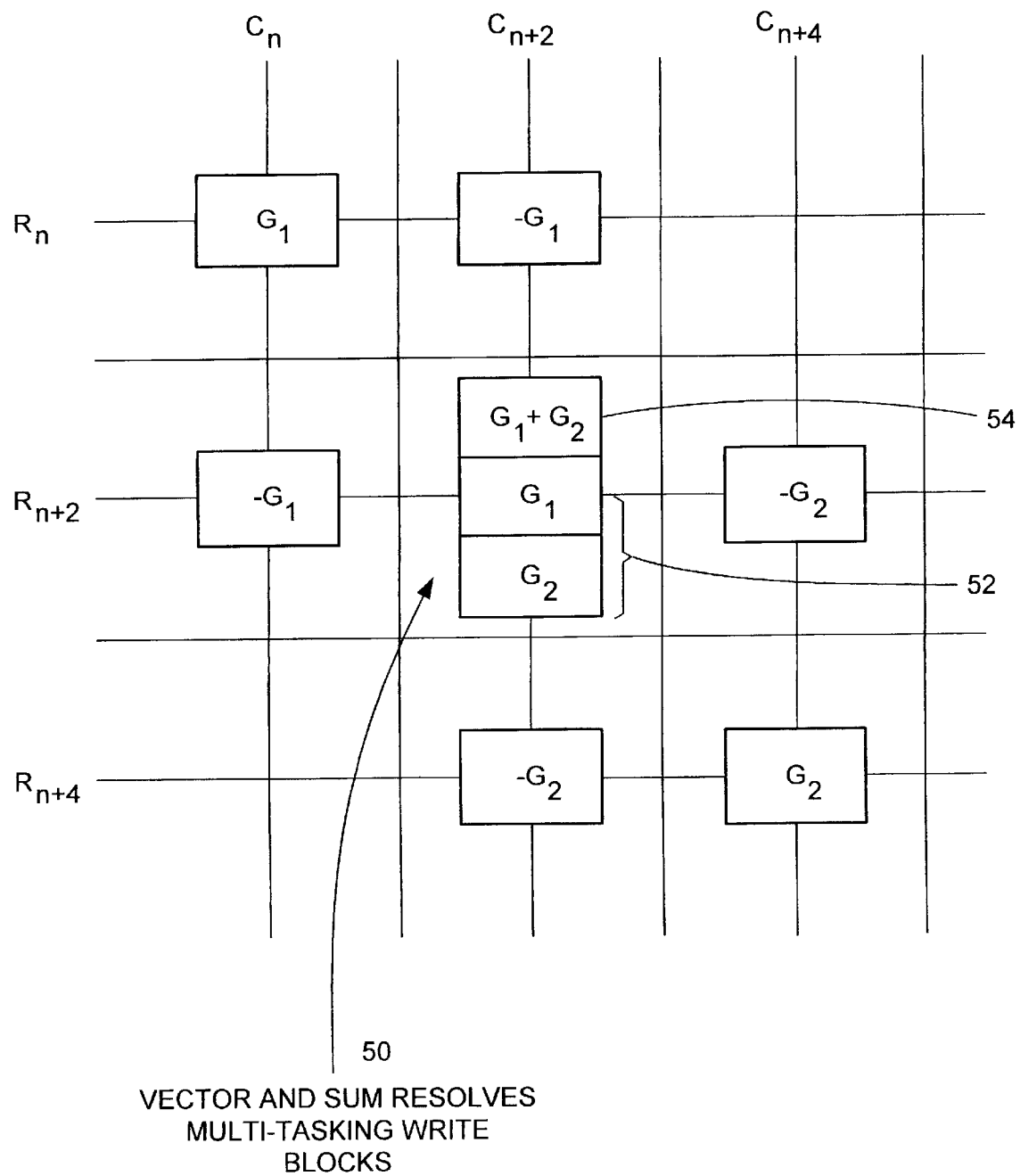
FIG. 5 illustrates a matrix incorporating the original Bischoff and Greenburg method of utilizing a sum value and a vector of individual conductances to overcome write blocking.
Figure 6:
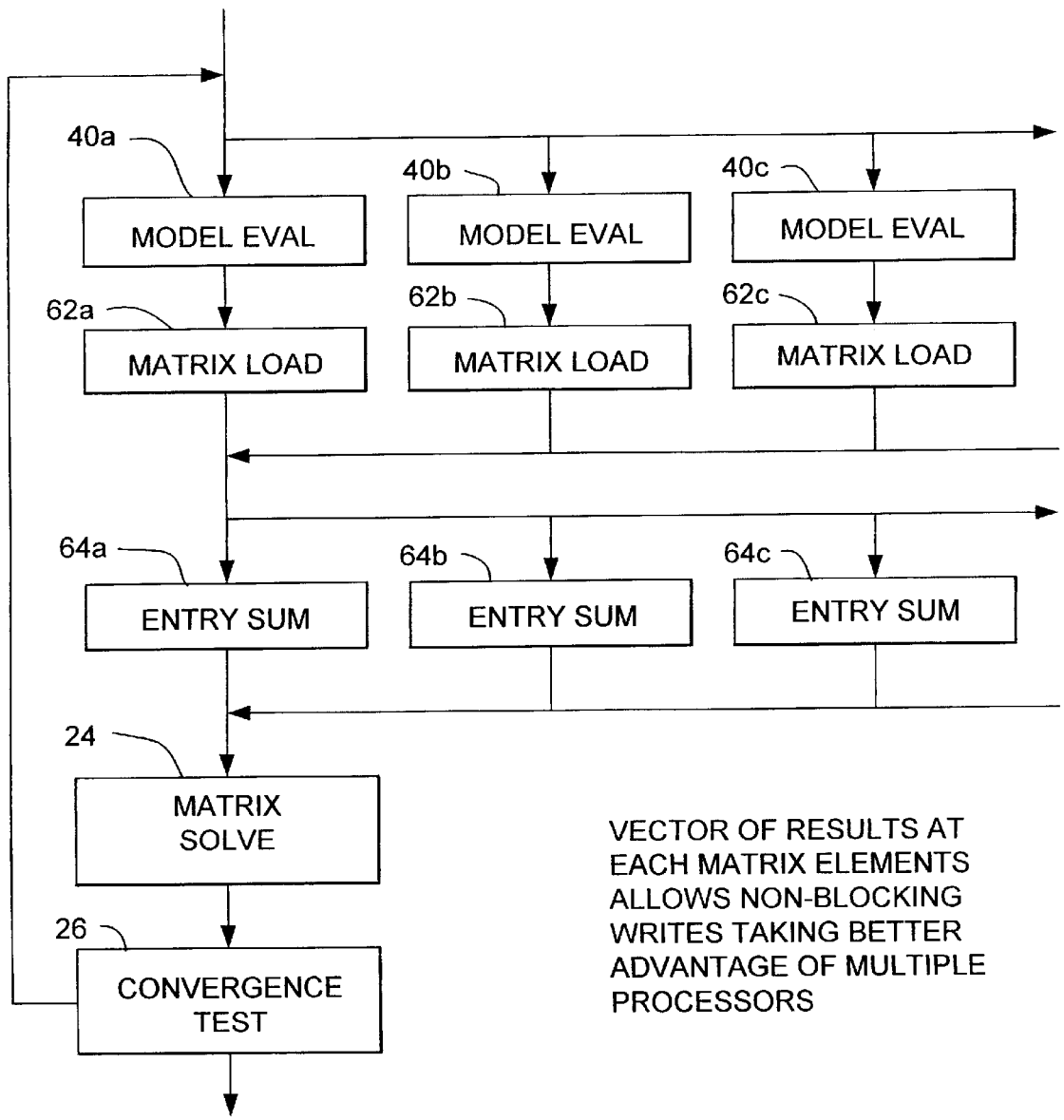
FIG. 6 is a flowchart illustrating a matrix solution loop with multiple processors and no memory write blocking.

One of the primary time savings of this invention derives from the elimination of many addition operations during the model evaluation phase when compared to the original SPICE method. In the flow diagram of FIG. 2, the matrix load phase for a multiple connection matrix entry requires the processor operations shown in Table 1 (SPICE column) in order to calculate the final conductance contribution for the two resistor example.

Pseudo code for a Zero Matrix and the Matrix Load phases of the original SPICE algorithm is:

| | Operations |
|---|---|
| <Zero Maxtrix> | |
| For each Matrix Entry | |
| Write A Zero | 1 Write Double |
| <Load Matrix> | |
| For Each Model Instance | |
| For Each G Pointer | |
| Get G Pointer | 1 Read Single |
| Get G Value | 1 Read Double |
| Contribute | 1 Add/Subtract |
| Write G Value | 1 Write Double |

Since Bischoff and Greenburg's method eliminates the Zero Matrix phase and moves part of the Matrix Load phase into the Model Evaluation phase, it provides a significant performance enhancement. However, the increased performance also requires the expense of more memory to hold the data structures. The pseudo code for the Model Evaluation and Entry Sum phases of Bischoff and Greenburg's method and this invention is:

| | Operations |
|---|---|
| <Model Evaluation> | |
| For Each Model Instance | |
| For Each G Pointer | |
| Get G Pointer | 1 Read Single |
| Write G Value | 1 Write Double |
| <Sum Entries> | |
| For Each Matrix Entry | |
| Get 1st G Value | 1 Read Double |

-continued

| Operations | |
|---|---|
| For G Values 2-N | |
| Get G Value | 1 Read Double |
| Contribute | 1 Add/Subtract |
| Write G$_{Sum}$ Value | 1 Write Double |

Therefore, in addition to enabling non-write blocked multi-processing, Bischoff and Greenburg's method significantly reduces the number of time-expensive double precision math operations at the expense of increasing the amount of memory required to hold the data structures. Table 1 compares the number of operations for the three methods when applied to the two resistor example in FIG. 1.

TABLE 1

Comparison of Operations

| Operation | SPICE | B&G | New |
|---|---|---|---|
| Read | 16 | 16 | 16 |
| Add/Subtract | 8 | 1 | 1 |
| Write | 15 | 15 | 15 |

Therefore, the present invention takes full advantage of the performance improvements of Bischoff and Greenburg's method. In addition, the present invention significantly reduces the amount of memory required to perform these operations. Table 2 summarizes the memory requirements for the three methods when applied to the two resistor example in FIG. 1.

| Memory Requirements | SPICE | B&G | New |
|---|---|---|---|
| Double Precision (64 bit, 8 bytes) | 9 | 17 | 9 |
| Pointer (32 bit, 4 bytes) | 8 | 15 | 22 |
| Total Bytes | 104 | 196 | 160 |

An additional benefit of the inverted data structure mechanism in this invention is the ability to enhance the performance of the Matrix Solution phase due to the inversion of the conductance pointers. In SPICE and it's derivatives, the node '0' is, by definition, the ground node and is always defined to be a value of zero volts.

The definition of the ground node at zero volts causes the set of linear equations of N nodes to be over-constrained due to the addition of the extra equation:

$$V_{Ground} = 0 \quad (2)$$

Because an over constrained system presents additional solution difficulties, no SPICE simulator (or any matrix-based solver for simultaneous linear equations) attempts to place the row or column for the ground node in the matrix. This leads to a problem in the Model Evaluation phase because the target locations for conductances of models that have nodes connected to the ground node do not exist in instances of the matrix, but do exist in the Model structures.

In SPICE and Cohen, the Model Evaluation phase has a different implementation from Quarles in that they attempt to avoid the problems caused by the missing ground node row and column. In SPICE and COHEN, the Model Evaluation phase must consider whether the matrix element for the conductance that is about to be stamped is actually in the ground node row or column. This requires three conditional tests according to the following algorithm:

```
// In the Model Instance/Matrix Construct Phase
If((Row == 0) or (Column == 0)) Ptr = -1
...
// In the Model Evaluation Phase
if( Ptr != -1 ) Matrix[Ptr] = Matrix[Ptr] + <G>
```

That is, if the row or the column is the ground node row or column, the value of the variable Ptr is set to -1. This requires two conditional tests (or at least one in optimized compilers). The value of Ptr is then tested during the Model Evaluation phase to see if it is a -1 (an additional test). If it is not equal to -1, then the existing value in the matrix is retrieved and the addition operator is used to add the conductance G.

In Quarles, the model instance data structure contains a pointer Ptr that is set to a dummy location (Junk) if the node is connected to the ground node (giving the model instance somewhere to point). This implementation eliminates the conditional tests during the Model Evaluation phase, but still makes a reference to the value stored in the variable Junk (hence, an additional operation performed in the model evaluation phase). The expense here is that the addition operation takes place whether or not the matrix element is in the ground node row or column. This addition operation always adds G to the Junk location. To prevent arithmetical over/underflow, the value of Junk is occasionally set to zero.

```
// In the Model Instance/Matrix Construct Phase
If(( Row == 0 ) or ( Column == 0 )) Ptr = &Junk
// Just someplace to write
...
// In the Model Evaluation Phase
*Ptr += <G>
```

Implementations according to SPICE, Cohen, and Quarles construct each model structure instance independent of whether a node is the ground. This is required due to the fact that Model structures are required to point into the matrix and must have valid pointers during Matrix Load in order to prevent a segmentation violation during the write phase. That is, there must be some place to write the data or the simulator will fail.

The present invention eliminates the need to consider the ground node as part of the Matrix Solution due to the fact that the Device Model structures have no knowledge of where in the matrix the model is used. During the Matrix Construction Phase, this invention never constructs the ground node row and column in the matrix. Since the row or column are never constructed and the Matrix Load no longer exists, the Matrix Solution phase never attempts to dereference them, thereby leading to reduced memory use and enhanced performance.

The entire effect of the present invention in terms of memory savings and performance enhancements depends on circuit configuration. In many integrated circuits, particularly CMOS circuits, there are many transistors (and other devices) that are tied by one or more terminals to the ground node. In SPICE and Cohen, this leads to much longer solution times due to the fact that the Model Evaluation code must continually either consider whether the connections are to the ground node in SPICE or continually perform an operation with no effect on the system of equations (adding a zero in Quarles). In general, any circuit that has many connections to ground will have increased performance and reduced memory use when evaluated in accordance with the present invention.

Portions of this invention may be conveniently implemented using a conventional general purpose digital computer or microprocessor programmed according to the teachings of the present specification, as will be apparent to those skilled in the computer art. Appropriate software coding can readily be prepared by skilled programmers based on the teachings of the present disclosure, as will be apparent to those skilled in the software art. The invention may also be implemented by the preparation of application specific integrated circuits or by interconnecting an appropriate network of conventional component circuits, as will be readily apparent to those skilled in the art.

Any portion of the present invention may be implemented on a general purpose digital computer or microprocessor and includes a computer program product which is a storage medium including instructions which can be used to program a computer to perform any of the above described processes of the invention. The storage medium can include, but is not limited to, any type of disk including floppy disks, optical discs, CD-ROMs, and magneto-optical disks, ROMs, RAMs, EPROMs, EEPROMs, magnetic or optical cards, or any type of media suitable for storing electronic instructions.

The foregoing description of the preferred embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A method of establishing matrix coefficients in a circuit simulation system, comprising the steps of:
   retrieving conductance elements corresponding to at least one matrix coefficient;
   storing each conductance element in at least one component model structure;
   building a data structure having plural nodes, each node corresponding to a matrix coefficient and having at least one pointer associated therewith:
   referencing at least one pointer in each respective node of said data structure from the data structure to at least one of said conductance elements which are stored in at least one of the component model structures and which correspond to the matrix coefficient of the respective node; and
   determining at least one of said matrix coefficients utilizing the respective nodes of said data structure that correspond to the matrix coefficients being established.

2. The method according to claim 1, wherein said step of determining comprises the steps of:
   dereferencing each pointer which is associated with a corresponding node to obtain conductance elements stored in the component model structure for the matrix coefficient being determined; and
   calculating said matrix coefficient utilizing the conductance elements obtained.

3. The method according to claim 2, including the step of:
   associating at least one of a positive indicator and a negative indicator to each conductance element referenced by each node of said data structure;
   wherein said step of calculating comprises the steps of:
      summing each conductance element indicated as being positive for said matrix coefficient;
      summing each conductance element indicated as being negative for said matrix coefficient; and
      subtracting summed negative conductance elements from the summed positive conductance elements to produce said matrix coefficient.

4. The method according to claim 2, including the step of:
   associating at least one of a positive indicator and a negative indicator to each conductance element referenced by each node of said data structure;
   wherein said step of calculating comprises the step of:
      combining the conductance elements by adding conductance elements indicated as being positive and subtracting conductance elements indicated as being negative to obtain a total conductance representing said matrix coefficient.

5. The method according to claim 1, further comprising the step of:
   associating at least one of a positive indicator and a negative indicator to each conductance element referenced by each node of said data structure.

6. The method according to claim 5, wherein said step of associating comprises the step of:
   dividing conductance elements referenced by each node into two sets, one set containing positive conductance elements and one set containing negative conductance elements.

7. The method according to claim 6, wherein said step of associating further comprises the step of:
   maintaining positive and negative indicators that identify, respectively, a number of conductance elements referenced by said set of positive conductance elements and said set of negative conductance elements.

8. The method according to claim 1, wherein said step of retrieving comprises the steps of:
   evaluating plural sets of at least one of physical and mathematical criteria to determine plural equations, each equation representing an effect that one of said plural sets of physical or mathematical criteria have on a result; and
   providing coefficients of each of said plural equations as said conductance elements.

9. The method according to claim 8, wherein said step of evaluating includes the step of:
   evaluating components in an electrical circuit to determine simultaneous equations representing either one of (1) voltage at selected nodes of said circuit and (2) current at selected nodes of said circuit.

10. The method according to claim 1, further comprising the step of:
    calculating a matrix coefficient for each node of said matrix by utilizing separate determining processes to perform said step of determining for each matrix coefficient in one of (1) each row of said matrix and (2) each column of said matrix.

11. A circuit simulator for evaluating quantities of a physical system represented by mathematical equations with plural variables, comprising:

a computer processing unit with media storage;
a computer simulator program that performs the steps of:
    defining a data structure representative of a matrix and having plural nodes, each node corresponding to a matrix coefficient;
    defining at least one component model structure that stores data elements of the quantities of the system being evaluated;
    identifying said data elements;
    storing said data elements in said at least one component model structure;
    referencing data elements in said component model structure via pointers maintained in nodes of said data structure and pointing to at least one of said component model structures;
    calculating at least one of said matrix coefficients utilizing data elements referenced by the pointers maintained in nodes of said data structure that correspond to the matrix coefficients being calculated; and
    using said matrix coefficients to simulate a circuit.

12. The circuit simulator according to claim 11, wherein said step of calculating comprises:
    utilizing separate processes to calculate each matrix coefficient for one of (1) each row of said matrix and (2) each column of said matrix.

13. The simulator according to claim 11, wherein:
    said system being evaluated is an electrical circuit;
    said quantities are one of voltages and currents at selected nodes of the electrical circuit; and
    said data elements are conductance components of electrical circuit components in the electrical circuit.

14. The circuit simulator according to claim 11, wherein:
    said identifying step identifies data elements from an input net list; and
    wherein said computer simulator program further performs the step of:
        recognizing, based on a predetermined element contained in said net list, at least one element to be placed in said component model structure, and at least one data element reference to be placed in said nodes of said data structure.

15. The circuit simulator according to claim 14, wherein said step of recognizing comprises:
    recognizing, based on a predetermined element contained in said net list, at least one pattern of elements to be placed in said component model structure, and at least one pattern of data element references to be placed in said nodes of said data structure.

16. An apparatus for storing and accessing matrix coefficients in a circuit simulation, comprising:
    an input device configured to input conductance elements corresponding to matrix coefficients;
    a storage device configured to store one or more conductance elements in at least one component model structure;
    a data structure comprising plural nodes, each node corresponding to a matrix coefficient and having at least one pointer;
    a pointer reference mechanism configured to reference pointers maintained in each respective node of said data structure from the data structure to conductance elements stored in at least one of the component model structures and which conductance elements pointed to by each respective node correspond to the matrix coefficient of the respective node; and
    an access device configured to access at least one of said matrix coefficients, by,
        utilizing nodes of said data structure to retrieve conductance elements corresponding to said at least one matrix coefficient, and
        calculating said at least one matrix coefficient from the retrieved conductance elements.

17. The apparatus according to claim 16, wherein said input device inputs said conductance elements via a netlist.

18. The apparatus according to claim 16, wherein said access device comprises:
    a dereference mechanism configured to de-reference each pointer associated with a corresponding node to obtain conductance elements stored in the component model structure for the matrix coefficient being accessed; and
    a calculator configured to determine a matrix coefficient utilizing the de-referenced conductance elements.

19. The apparatus according to claim 18, wherein:
    said data structure includes an indication of positive and negative for each conductance element referenced by the pointer reference mechanism; and
    said calculator determines said matrix coefficients by adding each conductance element indicated as being positive to the matrix coefficient being accessed, and subtracting each conductance element indicated as being negative from the matrix coefficient being accessed.

20. The apparatus according to claim 16, wherein said access device includes separate process mechanisms each configured to calculate each matrix coefficient for one of (1) each row of said matrix and (2) each column of said matrix.

21. An apparatus for storing and accessing matrix coefficients in a circuit simulation system, comprising:
    means for retrieving conductance elements corresponding to at least one matrix coefficient;
    means for storing each conductance element in at least one component model structure;
    means for building a data structure having plural nodes, each node corresponding to a matrix coefficient and having at least one pointer;
    means for referencing pointers maintained in each respective node of said data structure, and pointing from the data structure to conductance elements stored in at least one of the component model structures, said conductance elements pointed to by each respective node corresponding to the matrix coefficient of the respective node; and
    means for determining at least one of said matrix coefficients utilizing the pointers maintained in a node of said data structure corresponding to the matrix coefficients being determined.

22. The apparatus according to claim 21, further comprising:
    means for associating at least one of a positive indicator and a negative indicator to each conductance element referenced by each node of said data structure.

23. The apparatus according to claim 22, wherein said means for associating comprises:
    means for dividing conductance elements referenced by each node into two sets, one set containing positive conductance elements and one set containing negative conductance elements.

24. The apparatus according to claim 23, wherein said means for associating further comprises:
    means for maintaining positive and negative indicators that identify, respectively, a number of conductance elements referenced by said set of positive conductance elements and said set of negative conductance elements.

25. The apparatus according to claim 21, wherein said means for retrieving comprises:
   means for evaluating plural sets of at least one of physical and mathematical criteria to determine plural equations, each equation representing an effect that one of said plural sets of physical or mathematical criteria have on a result; and
   means for providing coefficients of each of said plural equations as said conductance elements.

26. The apparatus according to claim 25, wherein said means for evaluating includes:
   means for evaluating components in an electrical circuit to determine simultaneous equations representing either one of (1) voltage at selected nodes of said circuit and (2) current at selected nodes of said circuit.

27. The apparatus according to claim 21, wherein said means for determining comprises:
   means for dereferencing each pointer which is associated with a corresponding node to obtain conductance elements stored in the component model structure for the matrix coefficient being determined; and
   means for calculating said matrix coefficient utilizing the conductance elements obtained.

28. The apparatus according to claim 27, further comprising:
   means for associating at least one of a positive indicator and a negative indicator to each conductance element referenced by each node of said data structure;
   wherein said means for calculating comprises:
      means for combining the conductance elements by adding conductance elements indicated as being positive and subtracting conductance elements indicated as being negative to obtain a total conductance representing said matrix coefficient.

29. The apparatus according to claim 27, further comprising:
   means for associating at least one of a positive indicator and a negative indicator to each conductance element referenced by each node of said data structure;
   wherein said means for calculating comprises:
      means for summing each conductance element indicated as being positive for said matrix coefficient;
      means for summing each conductance element indicated as being negative for said matrix coefficient; and
      means for subtracting summed negative conductance elements from the summed positive conductance elements to produce said matrix coefficient.

30. A computer readable medium having computer instructions stored thereon that, when loaded into a computer, cause the computer to perform the steps of:
   retrieving conductance elements corresponding to at least one matrix coefficient;
   storing each conductance element in at least one component model structure;
   building a data structure having plural nodes, each node corresponding to a matrix coefficient and having at least one pointer associated therewith;
   referencing at least one pointer in each respective node of said data structure from said data structure to at least one of said conductance elements which are stored in at least one of the component model structures and which correspond to the matrix coefficient of the respective node; and
   determining at least one of said matrix coefficients from the component model structure utilizing nodes of said data structure corresponding to the matrix coefficients being determined.

31. The computer readable medium according to claim 30 wherein the stored computer instructions cause the computer to further perform the step of:
   associating at least one of a positive indicator and a negative indicator to each conductance element referenced by each node of said data structure.

32. The computer readable medium according to claim 31, wherein said step of associating comprises the step of:
   dividing conductance elements referenced by each node into two sets, one set containing positive conductance elements and one set containing negative conductance elements.

33. The computer readable medium according to claim 32, wherein said step of associating further comprises the step of:
   maintaining positive and negative indicators that identify, respectively, a number of conductance elements referenced by said set of positive conductance elements and said set of negative data elements.

34. The computer readable medium according to claim 30, wherein said step of retrieving comprises the steps of:
   evaluating plural sets of at least one of physical and mathematical criteria to determine plural equations, each equation representing an effect that one of said plural sets of physical or mathematical criteria have on a result; and
   providing coefficients of each of said plural equations as said conductance elements.

35. The computer readable medium according to claim 34, wherein said step of evaluating includes the step of:
   evaluating components in an electrical circuit to determine simultaneous equations representing either one of (1) voltage at selected nodes of said circuit and (2) current at selected nodes of said circuit.

36. The computer readable medium according to claim 30, wherein said instructions stored thereon further include the step of:
   calculating a matrix coefficient for each node of said matrix by utilizing separate determining processes each performing said step of determining for each matrix coefficient in one of (1) each row of said matrix and (2) each column of said matrix.

37. The computer readable medium according to claim 30, wherein said step of determining comprises the steps of:
   dereferencing each pointer which is associated with a corresponding node to obtain conductance elements stored in the component model structure for the matrix coefficient being accessed; and
   calculating said matrix coefficient utilizing the conductance elements obtained.

38. The computer readable medium according to claim 37, including the step of:
   associating at least one of a positive indicator and a negative indicator to each conductance element referenced by each node of said data structure; and
   wherein said step of calculating comprises:
      combining the conductance elements by adding conductance elements indicated as being positive and subtracting conductance elements indicated as being negative to obtain a total conductance representing said matrix coefficient.

39. The computer readable medium according to claim 37, including the step of:

associating at least one of a positive indicator and a negative indicator to each conductance element referenced by each node of said data structure; and wherein said step of calculating comprises the steps of:
summing each conductance element indicated as being positive for said matrix coefficient;
summing each conductance element indicated as being negative for said matrix coefficient; and
subtracting summed negative conductance elements from the summed positive conductance elements to produce said matrix coefficient.

40. A method of storing and accessing matrix coefficients, comprising the steps of:

retrieving data elements corresponding to at least one matrix coefficient;

storing each data element in at least one model;

building a data structure having plural nodes, each node corresponding to a matrix coefficient and having at least one pointer associated therewith;

referencing at least one pointer in each respective node of said data structure from the data structure to at least one of said reference model stored data elements which correspond to the matrix coefficient of the respective node; and determining at least one of said matrix coefficients from model stored data elements pointed to by pointers stored in a node corresponding to the matrix coefficient being determined.

41. The method according to claim 40, wherein said step of determining comprises the steps of:

dereferencing each pointer to data elements contained in said at least one model to obtain data elements of the matrix coefficient being accessed; and calculating said matrix coefficient utilizing the data elements obtained.

42. The method according to claim 41, further comprising the step of:

associating one of a positive and a negative indicator to each data element referenced in each node of said data structure; and wherein said step of calculating comprises:
combining the data elements by adding data elements indicated as being positive and subtracting data elements indicated as being negative to obtain a total representing said matrix coefficient.

43. The method according to claim 40, further comprising the step of:

calculating a matrix coefficient for each node of said matrix by utilizing separate determining processes each performing said step of determining for each matrix coefficient in one of (1) each row of said matrix and (2) each column of said matrix.

* * * * *